(12) United States Patent
Thekkath et al.

(10) Patent No.: US 7,065,675 B1
(45) Date of Patent: Jun. 20, 2006

(54) SYSTEM AND METHOD FOR SPEEDING UP EJTAG BLOCK DATA TRANSFERS

(75) Inventors: Radhika Thekkath, Palo Alto, CA (US); Scott Michael McCoy, Sunnyvale, CA (US); Franz Treue, Palo Alto, CA (US); Morten Zilmer, Vaerloese (DK); G. Michael Uhler, Menlo Park, CA (US)

(73) Assignee: MIPS Technologies, Inc., Mountain View, CA (US)

( * ) Notice: Subject to any disclaimer, the term of this patent is extended or adjusted under 35 U.S.C. 154(b) by 945 days.

(21) Appl. No.: 09/850,195

(22) Filed: May 8, 2001

(51) Int. Cl.
*G06F 11/00* (2006.01)
(52) U.S. Cl. ..................... 714/30; 714/727
(58) Field of Classification Search .............. 714/30, 714/726, 727
See application file for complete search history.

(56) References Cited

U.S. PATENT DOCUMENTS

| | | | |
|---|---|---|---|
| 3,474,154 A | 10/1969 | Couleur et al. | |
| 3,585,599 A | 6/1971 | Hitt | |
| 3,681,534 A | 8/1972 | Burian et al. | |
| 3,702,989 A | 11/1972 | Provenzano, Jr. et al. | |
| 3,704,363 A | 11/1972 | Salmassy et al. | |
| 3,707,725 A | 12/1972 | Dellheim | |
| 3,771,131 A | 11/1973 | Ling | |
| 3,794,831 A | 2/1974 | Frankeny et al. | |
| 3,805,038 A | 4/1974 | Buedel et al. | |
| 3,906,454 A | 9/1975 | Martin | |
| 4,205,370 A | 5/1980 | Hirtle | |
| 4,293,925 A | 10/1981 | Hang et al. | |
| 4,423,508 A | 12/1983 | Shiozaki et al. | |
| 4,462,077 A | 7/1984 | York | |
| 4,503,495 A | 3/1985 | Boudreau | |
| 4,511,960 A | 4/1985 | Boudreau | |
| 4,539,682 A | 9/1985 | Herman et al. | |
| 4,553,223 A | 11/1985 | Bouhelier et al. | |
| 4,554,661 A | 11/1985 | Bannister | |
| 4,590,550 A | 5/1986 | Eilert et al. | |
| 4,742,466 A | 5/1988 | Ochiai et al. | |
| 4,783,762 A | 11/1988 | Inoue et al. | |
| 4,835,675 A | 5/1989 | Kawai | |
| 5,058,114 A | 10/1991 | Kuboki et al. | |
| 5,084,814 A | 1/1992 | Vaglica et al. | |
| 5,150,470 A | 9/1992 | Hicks et al. | |

(Continued)

FOREIGN PATENT DOCUMENTS

GB 2 329 048 10/1999

(Continued)

OTHER PUBLICATIONS

"In-Target System Analyzer for MIPS", 2004, FS2 [http://www.fs2.com/mips_download/readme-linux.txt].*

(Continued)

*Primary Examiner*—Scott Baderman
*Assistant Examiner*—Gabriel L. Chu
(74) *Attorney, Agent, or Firm*—Cooley Godward LLP (57) ABSTRACT

A system and method for providing efficient block transfer operations through a test access port uses a Fastdata register. The Fastdata register, in part, emulates a pending process access bit ("PrAcc") typically found in a Control register associated with the test access port. When a Fastdata access (either a Fastdata upload or a Fastdata download) is requested by a probe coupled to the test access port, the Fastdata register is serially coupled to a data register also associated with the test access port. With these registers so coupled and through the operation of the Fastdata register, downloading and uploading data can be accomplished using a single register operation.

34 Claims, 4 Drawing Sheets

U.S. PATENT DOCUMENTS

| | | | |
|---|---|---|---|
| 5,274,811 A | 12/1993 | Borg et al. | |
| 5,289,587 A | 2/1994 | Razban | |
| 5,355,369 A * | 10/1994 | Greenberger et al. | 714/727 |
| 5,404,470 A | 4/1995 | Miyake | |
| 5,434,622 A | 7/1995 | Lim | |
| 5,471,594 A | 11/1995 | Stone | |
| 5,473,754 A | 12/1995 | Folwell et al. | |
| 5,491,793 A | 2/1996 | Somasundaram et al. | |
| 5,533,193 A | 7/1996 | Roscoe | |
| 5,581,691 A | 12/1996 | Hsu et al. | |
| 5,598,421 A | 1/1997 | Tran et al. | |
| 5,621,886 A | 4/1997 | Alpert et al. | |
| 5,625,785 A | 4/1997 | Miura et al. | |
| 5,642,478 A | 6/1997 | Chen et al. | |
| 5,642,479 A | 6/1997 | Flynn | |
| 5,687,179 A | 11/1997 | Whetsel, Jr. et al. | |
| 5,689,636 A | 11/1997 | Kleber et al. | |
| 5,689,694 A | 11/1997 | Funyu | |
| 5,715,435 A | 2/1998 | Ikei | |
| 5,724,505 A | 3/1998 | Argade et al. | |
| 5,748,904 A | 5/1998 | Huang et al. | |
| 5,751,942 A | 5/1998 | Christensen et al. | |
| 5,752,013 A | 5/1998 | Christensen et al. | |
| 5,764,885 A | 6/1998 | Sites et al. | |
| 5,790,561 A | 8/1998 | Borden et al. | |
| 5,802,272 A | 9/1998 | Sites et al. | |
| 5,812,868 A | 9/1998 | Moyer et al. | |
| 5,832,515 A | 11/1998 | Ledain et al. | |
| 5,835,503 A | 11/1998 | Jones et al. | |
| 5,848,264 A | 12/1998 | Baird et al. | |
| 5,878,208 A | 3/1999 | Levine et al. | |
| 5,944,841 A | 8/1999 | Christie | |
| 5,946,486 A | 8/1999 | Pekowski | |
| 5,970,246 A | 10/1999 | Moughani et al. | |
| 5,978,937 A | 11/1999 | Miyamori et al. | |
| 5,996,092 A | 11/1999 | Augsburg et al. | |
| 6,009,270 A | 12/1999 | Mann | |
| 6,012,085 A | 1/2000 | Yohe et al. | |
| 6,032,268 A | 2/2000 | Swoboda et al. | |
| 6,032,279 A * | 2/2000 | Ramamurthy et al. | 714/727 |
| 6,061,473 A | 5/2000 | Chen et al. | |
| 6,094,729 A | 7/2000 | Mann | |
| 6,106,573 A | 8/2000 | Mahalingaiah et al. | |
| 6,145,123 A | 11/2000 | Torrey et al. | |
| 6,256,777 B1 | 7/2001 | Ackerman | |
| 6,282,701 B1 | 8/2001 | Wygodny et al. | |
| 6,314,530 B1 | 11/2001 | Mann | |
| 6,338,159 B1 | 1/2002 | Alexander | |
| 6,353,924 B1 | 3/2002 | Ayers et al. | |
| 6,381,721 B1 * | 4/2002 | Warren | 714/727 |
| 6,430,727 B1 * | 8/2002 | Warren | 716/4 |
| 6,457,144 B1 | 9/2002 | Eberhard | |
| 6,467,083 B1 | 10/2002 | Yamashita | |
| 6,484,273 B1 * | 11/2002 | Chang | 714/30 |
| 6,484,275 B1 * | 11/2002 | Josephson et al. | 714/39 |
| 6,487,715 B1 | 11/2002 | Chamdani et al. | |
| 6,530,076 B1 | 3/2003 | Ryan et al. | |
| 6,594,741 B1 * | 7/2003 | Chang | 711/156 |
| 6,615,370 B1 | 9/2003 | Edwards et al. | |
| 6,615,371 B1 | 9/2003 | McCullough et al. | |
| 6,658,649 B1 | 12/2003 | Bates et al. | |
| 6,684,348 B1 | 1/2004 | Edwards et al. | |
| 6,687,865 B1 | 2/2004 | Dervisoglu et al. | |
| 6,754,804 B1 | 6/2004 | Hudepohl et al. | |
| 6,966,021 B1 * | 11/2005 | Rajski et al. | 714/726 |
| 2001/0054175 A1 | 12/2001 | Watanabe | |
| 2002/0046393 A1 | 4/2002 | Leino et al. | |
| 2002/0147965 A1 | 10/2002 | Swaine et al. | |
| 2002/0184562 A1 * | 12/2002 | Nadeau-Dostie et al. | 714/30 |

FOREIGN PATENT DOCUMENTS

| | | |
|---|---|---|
| GB | 2 329 049 | 10/1999 |

OTHER PUBLICATIONS

MIPS64 5Kc™ Processor Core Datasheet, Revision 1.7.4, pp. 1-40, Dec. 14, 1999.

MIPS64 5Kc™ Processor Core Datasheet, Revision 1.7.5, pp. 1-40, Aug. 11, 2000.

MIPS64 5Kc™ Processor Core Datasheet, Revision 2.0, pp. 1-44, Aug. 28, 2000.

MIPS64™ 5Kf™ Processor Core Datasheet, Revision 00.11, pp. 1-44, Mar. 30, 2001.

MIPS64 5Kc™ Processor Core Software User's Manual, Revision 2.2, pp. 1-580, Aug. 11, 2000.

MIPS Technologies, EITAG Specification, Revision 2.60, Feb. 15, 2001.

Embedded Trace Macrocell Specification, Rev. 0/0a, ARM IHI 0014C, ARM Ltd. (1999).

F. Chow et al., "Engineering a RISC Compiler System," *IEEE COMP-CON*, Mar. 1986, pp. 132-137.

Faloutsos, Christos et al., "Description and Performance Analysis of Signature File Methods for Office Filing", ACM Transactions on Office Information Systems, (Jul. 1987), 5:3:237-257.

Susan J. Eggers, et al., "Techniques for Efficient Inline Tracing on a Shared-Memory Multiprocessor," University of Washington, *1990 ACM*, pp. 37-47.

M.D. Smith, "Tracing with Pixie," *Technical Report CSL-TR-91-497*, Stanford University, Computer Systems Laboratory, Nov. 1991, pp. 1-29.

ATOM Reference Manual, *Digital Equipment Corporation*, Massachusetts, Dec. 1993, pp. 1-32.

A. Srivastaba et al., "ATOM: A System for Building Customized Program Analysis Tools," *WRL, Research* Report 94/2, Digital Equipment Corporation, Massachusetts, Mar. 1994, pp. 1-23.

ATOM User Manual, Digital Equipment Corporation, Mar. 1994, pp. 1-28.

B. Cmelik et al., "Shade: A Fast Instruction-Set Simulator for Execution Profiling," *Proceedings of the 1994 ACM SIGMETRICS Conference*, SIGMETRICS, California, May 1994, pp. 128-137.

Richard A. Uhlig, et al., "Trace-Driven Memory Simulation: A Survey," Intel Microcomputer Research Lab; University of Michigan, *ACM Computing Surveys*, vol. 29, No. 2, Jun. 1997, pp. 128-170.

Eric Rotenberg, et al., "Trace Processors," University of Wisconsin, 1997 *IEEE Service Center*, 12 pp.

E.N. Elnozahy, "Address Trace Compression Through Loop Detection and Reduction," 201 *1999 ACM 1-58113-083*, pp. 214, 215.

MIPS Technologies: "MIPS64™ 5K™ Processor Core Family Integrator's Guide," [Document No. MD00106]; ©*1999-2001 MIPS Technologies, Inc.*; Rev. 02.00; Jan. 15, 2001; pp. I-VIII, 1-75.

Darren Jones, "Opal Coprocessor Interface," *MIP Propletary/Confidential*, Jun. 4, 1999, pp. 1-18.

Darren Jones, *MIPSS64™ 5KC™ Processor Cores User's Manual*, Rev. 1.0, Jul. 4, 1999, pp. 6-1 to 6-26.

*MIPSS64™ 5KC™ Processor Cores User's Manual*, Rev. 1.0.1., 1999, pp. 247-276.

Embedded Trace Macrocell, (Rev. 1) Specification, (2000).

MIPS Technologies; "MIPS64™ 5K™ Processor Core Integrator's Guide;" [Document No. MD00056]; *MIPS Technologies, Inc.*; Rev. 1.2; Aug. 11, 2000; pp. 1-11, 1-82.

MIPS Technologies; "Core Processor Interface Specification;" [Document No. MD00068]; *MIPS Technologies, Inc.*; Rev. 1.11; Mar. 30, 2001; pp. 1-26.

U.S. Appl. No. 09/751,747, filed Dec. 29, 2000, Hudepohl et al.

U.S. Appl. No. 09/751,748, filed Dec. 29, 2000, Hudepohl et al.

U.S. Appl. No. 09/844,671, filed Apr. 30, 2001, Thekkath et al.

U.S. Appl. No. 09/844,669, filed Apr. 30, 2001, Thekkath.

U.S. Appl. No. 09/894,832, filed Jun. 29, 2001, Thekkath et al.

U.S. Appl. No. 09/844,668, filed Apr. 30, 2001, Thekkath et al.

U.S. Appl. No. 09/844,672, filed Apr. 30, 2001, Thekkath.

U.S. Appl. No. 09/844,673, filed Apr. 30, 2001, Thekkath.

U.S. Appl. No. 09/844,271, filed Apr. 30, 2001, Thekkath.

U.S. Appl. No. 09/894,831, filed Jun. 29, 2001, Treue et al.

U.S. Appl. No. 09/894,830, filed Jun. 29, 2001, Treue et al.

U.S. Appl. No. 09/844,670, filed Apr. 30, 2001, Thekkath.

* cited by examiner

SYSTEM AND METHOD FOR SPEEDING UP EJTAG BLOCK DATA TRANSFERS

BACKGROUND

1. Field of the Invention

The present invention relates generally to integrated circuits and more particularly to efficient block data transfers over a serial test port.

2. Discussion of the Related Art

Complex integrated circuits have become increasingly difficult to test. One mechanism for testing these complex integrated circuits uses a Joint Test Action Group ("JTAG") test access port ("TAP") as defined in IEEE Standard 1149.1, IEEE Standard Test Access Port and Boundary-Scan Architecture (the "IEEE Standard"), which is incorporated herein by reference in its entirety for all purposes. The JTAG TAP provides an external interface to the integrated circuit whereby the integrated circuit can be debugged. According to the standard, a TAP is added to each integrated circuit. The TAP includes at least three inputs: a test clock ("TCLK"), a test mode select ("TMS"), and a test data in ("TDI") port. The TAP includes at least one output: a test data out ("TDO") port. Data is serially shifted from the TDI port and into the integrated circuit and serially shifted out of the integrated circuit and onto the TDO port. In this manner, "test vectors" may be written to or read from the integrated circuit via a test probe to determine whether the integrated circuit is operating properly.

Software debug on complex integrated circuits has likewise become increasingly difficult to conduct. In this regard, an extension of the JTAG standard, referred to as EJTAG, has been developed. EJTAG is a hardware/software subsystem that provides comprehensive debugging and performance tuning capabilities to processors and to system-on-chip components having processor cores. EJTAG exploits the infrastructure provided by the JTAG Test Access Port (TAP) standard to provide an external interface, and extends an instruction set of the processor and privileged resource architectures to provide a standard software architecture for integrated system debugging.

Using EJTAG, instructions to be executed by the processor, in addition to data, may be downloaded to the processor via the test probe. Serially downloading instructions, which are executed as they are received by the processor, causes the processor to operate particularly slowly. One conventional mechanism to speed up this process is to download all the instructions to be executed by the processor to some portion of the processor's memory upon entering debug mode.

As serially shifting instructions and data to and from a processor through EJTAG is extremely time consuming relative to the operational speeds of the processor, existing EJTAG protocols (specifically, versions 2.5 and earlier) may require as many as 149 overhead test clock ("TCK") cycles for every 32 bits of instruction or data transferred. Accordingly, even at reasonable rates for TCK, transferring large blocks of instructions or data to and from the integrated circuit is often measured in terms of minutes.

What is needed therefore is a system and method for improving efficiency of block data transfer operations to and from a processor implementing EJTAG.

DETAILED DESCRIPTION

An embodiment of the invention is discussed in detail below. While specific implementations are discussed, it should be understood that this is done for illustration purposes only. More particularly, the present invention is described in terms of a particular Extended Joint Test Access Group ("EJTAG") implementation developed by MIPS Technologies, Inc., 1225 Charleston Road, Mountain View, Calif. 94043-1353 ("MIPS Technologies"), which is an extension to the JTAG standard mentioned above. A complete discussion of the EJTAG implementation is described in *EJTAG Specification*, Document Number MD00047, Revision 2.60, dated Feb. 15, 2001, by MIPS Technologies (the "EJTAG Specification"), which is incorporated herein by reference in its entirety for all purposes. A person skilled in the relevant art will recognize that other components and configurations may be used without departing from the spirit and scope of the invention.

Figure 1:
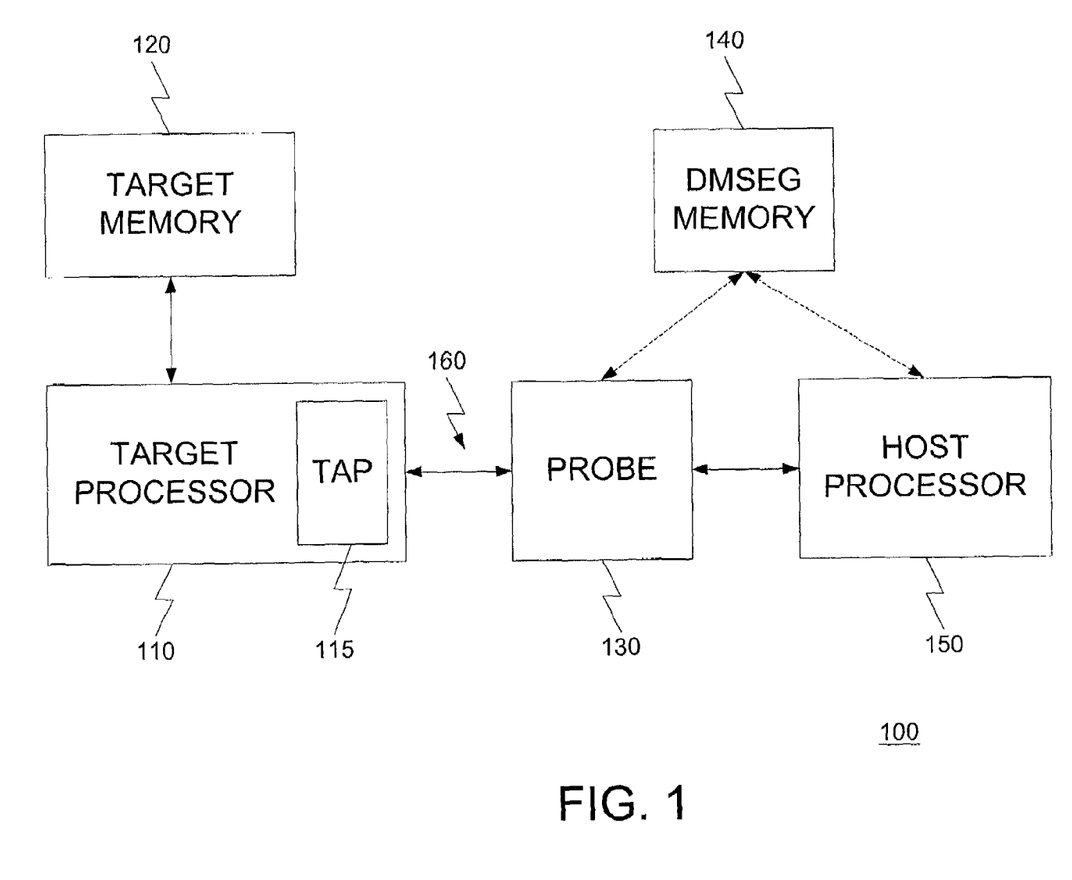
FIG. 1 illustrates a system for device testing and software debug on integrated circuits according to the present invention.

FIG. 1 illustrates a testing system 100 for testing an integrated circuit, which in this example is a target processor 110. Target processor 110 includes a test access port ("TAP") 115 that services a number of signals including Test Clock ("TCK"), Test Mode ("TMS"), Test Data In ("TDI") and Test Data Out ("TDO"). TCK and TMS control the state of a TAP controller (not shown), which is a state machine that controls access to certain registers within TAP 115. Access to these registers occurs serially through TDI and TDO. The structure and functionality of TAP 115 are described in greater detail below, and in the EJTAG Specification and IEEE Standard. Interfaced to target processor 110 is a target memory 120 resident either within target processor 110, external to target processor 110, or some combination of the two. Target processor 110 is any programmable semiconductor device including a microprocessor, microcontroller, System-On-a-Chip ("SOC") component (e.g., ASIC, ASSP), etc.

Testing system 100 also includes a test probe 130 operating in conjunction with a host processor 150. Probe 130 functions as an interface between target processor 110 (specifically, TAP 115 of target processor 110) and host processor 150. Probe 130 communicates with target processor 110 via a serial link 160. The operations of probe 130 and host processor 150 for purposes of debugging target processor 110 are generally well known.

Probe 130 and host processor 150 together emulate an overlay region of memory referred to as a dmseg (i.e., debug memory segment) memory 140 that can be accessed by target processor 110 during debug mode operations. For example, when host processor 150 enters debug mode, a debug exception handler might lie in dmseg memory 140.

Hence, the first instruction fetched by host processor 150 would be an address in dmseg memory 140. This dmseg memory 140 is emulated using memory associated with probe 130, memory associated with host processor 150, or some combination of the two. The operation of dmseg memory 140 for purposes of debugging target processor 110 is also generally well known.

Figure 2:
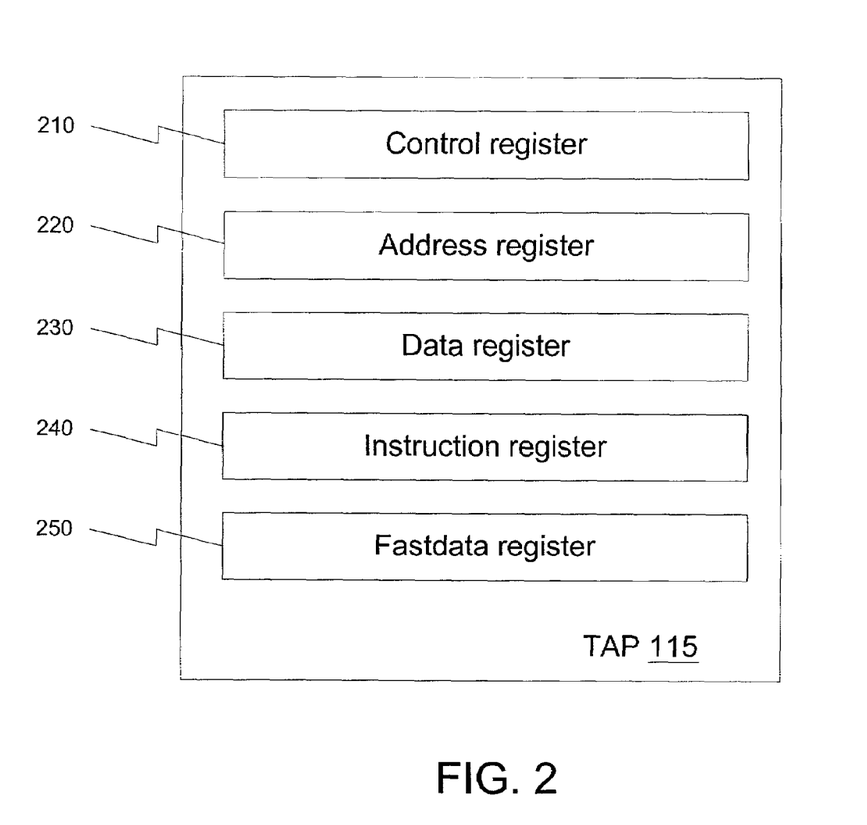
FIG. 2 illustrates various registers associated with a test access port according to the present invention.

FIG. 2 illustrates various registers included in TAP 115 that are accessed via serial link 160 that operates as a communication channel between target processor 110 and probe 130 when target processor 110 operates in debug mode. These registers include, among others, a Control register 210, an Address register 220, a Data register 230, and an Instruction register 240. Control register 210 includes various status flags that control features and operations associated with the EJTAG Specification. Address register 220 allows target processor 110 to indicate a specific address in dmseg memory 140 that it wishes to access. Data register 230 allows target processor 110 to transfer data to and from dmseg memory 140. Instruction register 240 provides a mechanism for probe 130 and host processor 150 to select one of (or a combination of) the other registers to which to write or from which to read. The operations of these four registers are also generally well known.

Figure 3:
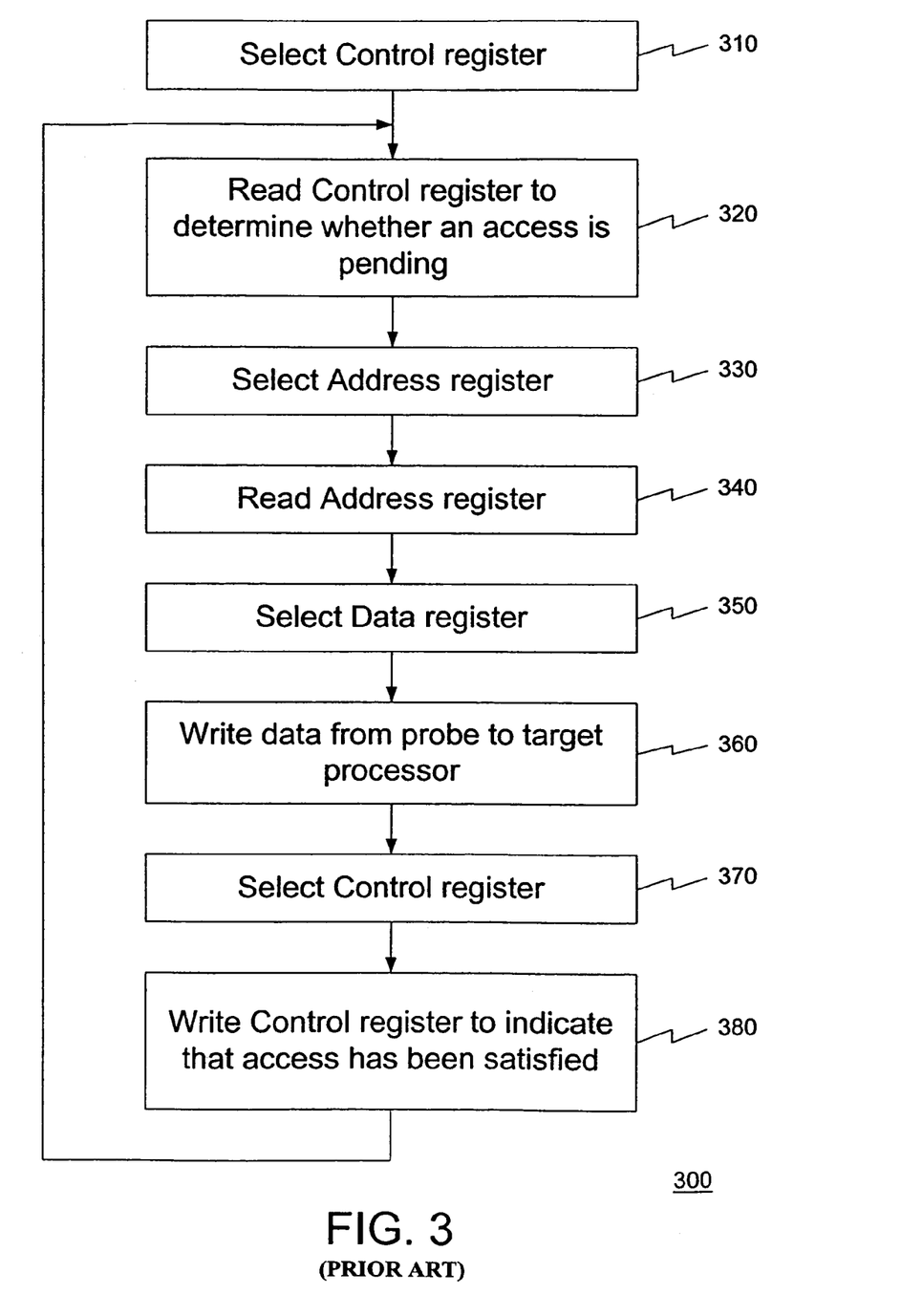
FIG. 3 illustrates a transfer of data through a test access port in accordance with an operation of a conventional test system.

Before describing the present invention in further detail, a description of how conventional EJTAG debug systems transfer large blocks of data or instructions is provided with reference to FIG. 3. For purposes of illustration, the following discussion describes how a block of data is transferred from probe 130 to target processor 110, or more specifically, from dmseg memory 140 to target memory 120. A similar operation is required to transfer a block of data from target memory 120 to dmseg memory 140 as will be apparent from the following description.

In an operation 310, Control register 210 is selected in order for probe 130 to read the contents of Control register 210, namely to determine whether a processor access pending ("PrAcc") bit is set. When target processor 110 attempts to access dmseg memory 140 while in debug mode, the PrAcc bit in Control register 210 is set. The PrAcc bit functions as a handshake between target processor 110 and probe 130 indicating that target processor 110 is ready to access dmseg memory 140 with a load, a store, or a fetch operation. In one embodiment of the present invention, Control register 210 is selected by clocking an appropriate 5-bit command from probe 130 into Instruction register 240 of TAP 115. This command prepares TAP 115 to provide probe 130 with the contents of Control register 210.

In an operation 320, Control register 210 is read to determine whether there is a pending access by target processor 110 of dmseg memory 140. More specifically, the PrAcc bit in Control register 210 is read to determine this pending access. Probe 130 periodically polls Control register 210 to determine whether a processor access is pending by clocking the entire Control register 210 from TAP 115 to probe 130. Once the contents of Control register 210 are received, probe 130 is able to access PrAcc bit to determine whether target processor 110 is waiting to read from or write to dmseg memory 140.

When a processor access is pending, in an operation 330, Address register 220 is selected so that the address in dmseg memory 140 where the data is to be read can be transferred from target processor 110 to probe 130. In one embodiment of the present invention, this is accomplished by clocking an appropriate 5-bit command from probe 130 into Instruction register 240 of TAP 115. This command prepares TAP 115 to provide the contents of Address register 220 to probe 130.

In an operation 340, m-bits (dependant upon an address space of dmseg memory 110) of address from Address register 220 are clocked from TAP 115 to probe 130. This is the address in dmseg memory 140 from which data is to be retrieved and placed in Data register 230.

In an operation 350, Data register 230 is selected so that data can be transferred from probe 130 to target processor 110, or again, more specifically, from dmseg memory 140 to target memory 120. In one embodiment of the present invention, this is accomplished by clocking an appropriate 5-bit command from probe 130 into Instruction register 240 of TAP 115 to select Data register 230. Once Data register 230 is selected, when operation 360 is a write operation, n-bits of data (dependant upon a word size of target processor 110) are clocked from probe 130 to target processor 110. More specifically, n-bits of data from the address in dmseg memory 140 indicated by Address register 220 are clocked into Data register 230. Target processor 110 can then store the contents of Data register 230 to target memory 120. Store operations are similar as would be apparent from the above description. Specifically, when operation 360 is a read operation (i.e., an upload or transfer of a block of data from target memory 120 to dmseg memory 140), Address register 220 contains the address of dmseg memory 140 where data is to be stored, Data register 230 contains the data to be stored in dmseg memory, and operation 360 clocks the contents of the Data register to probe 130, which then stores the data in dmseg memory 140.

In an operation 370, after clocking in the data to Data register 230, Control register 210 is again selected, this time to write to its contents. In an operation 380, probe 130 clears PrAcc bit (in one embodiment of the present invention) to indicate that the pending access to dmseg memory 140 by target processor 110 has been satisfied by probe 130. These same operations would also occur after a store operation, as would be apparent from the above description.

Operations 320–380 transfer a single data word from probe 130 to target processor 110. These operations must be repeated in a conventional EJTAG debug system for each data word transferred to and from dmseg memory 140 as indicated by the loop of FIG. 3. In order to accomplish this transfer, a total of 79+m bits of overhead are required to transfer n bits of data. This is highly inefficient and time consuming, particularly over a relatively slow serial communication channel.

Moreover, as noted above, operations 320–380 must be repeated for each word in a block of data that is transferred to and from dmseg memory 140. Such block transfer is achieved, for example, by host processor 150 creating a simple loop routine that causes target processor 110 to carry out multiple load or store operations. As is well known, such a routine may be created by host processor 150 and downloaded to target memory 120 via probe 130 (using the process described in FIG. 3, for example). Target processor 110 is then made to jump to the routine (directed by probe 130) to carry out the block transfer. When the transfer is completed, target processor 110 jumps out of the routine. Because host processor 150 creates the routine, it specifies the addresses that make up the block of data loaded from or stored to target memory 120. Similarly, host processor 150 defines which address or addresses are accessed in dmseg memory 120 to carry out the block transfer. If a single memory location in dmseg memory 140 is repeatedly specified, host processor 150 will ensure that the memory location is timely serviced to provide or retrieve the necessary data when writing to and reading from respectively, Data register 230 (for example).

Operations 320–380 represent a conservative and safe approach to transferring data or instructions from probe 130 to target processor 110. Some assumptions might be made to eliminate one or more of these operations. For example, when the operational speed of target processor 110 is far greater than the operational speed of probe 130, a developer may assume during block transfers that each time through the loop of operation 300, target processor 110 has completed its other tasks and is again waiting for probe 130 to transfer another data word. More specifically, the determination, in operation 320, of whether a processor access is pending will be assumed. This assumption eliminates a need to read Control register 210 as performed by operation 320. Another assumption that may be made by the developer is that an address in Address register 220 is known each time through the loop. For example, the developer may pre-establish a particular type of block transfer between probe 130 and target processor 110 such that these types of block transfers will occur at a predetermined address. This assumption eliminates the need to select and read Address register 220 for each data word transferred. Using the two assumptions thus described, the loop of operation 300 may be reduced to operations 350–380. Although this reduced loop runs faster than the previously described loop, it still requires a fair amount of overhead to transfer blocks of data or instructions. Moreover, the two assumptions made above render the loop "unsafe" and make error recovery somewhat difficult.

To further increase the speed of block transfers between probe 130 and target processor 110 while eliminating the need to make the aforementioned assumptions, TAP 115 of the present invention includes a Fastdata register 250. Fastdata register 250 provides a mechanism whereby operation 300 of the conventional test system is replaced with a single register data transfer operation as will be described below in further detail. In conjunction with Fastdata register 250, various embodiments of the present invention may also include a FASTDATA instruction. The FASTDATA instruction will also be described in further detail below.

In one embodiment of the present invention, Fastdata register 250 is a one-bit read/write register where the single bit is referred to as a SPrAcc bit. TABLE I summarizes the operation of Fastdata register 250. As reflected in TABLE I, TAP 115 of the present invention implements Fastdata register 250 as follows. A request for a Fastdata access succeeds if 1) a processor access is pending (i.e., PrAcc has been set), and 2) the Fastdata access is to a particular area of dmseg memory 140. The first requirement ensures that target processor 110 is waiting for probe 130 to satisfy the Fastdata access as opposed to merely assuming that one is pending as described.

TABLE I

Fastdata Register Operations

| Fields | | | |
|---|---|---|---|
| Name | Bits | Action | Result |
| SPrAcc | 0 | Clearing SPrAcc. In one embodiment, this in accomplished by shifting in a value of '0'. | Requests completion of the Fastdata access. The PrAcc bit in the control register is overwritten with zero when the access succeeds. (The access succeeds if PrAcc is one and the operation address is in the legal dmseg Fastdata area.) A value of '1' for SPrAcc is shifted out when the access succeeds; a value of '0' for SPrAcc is shifted out when the access fails. |
| | | Setting SPrAcc. In one embodiment, this is accomplished by shifting in a value of '1'. | The PrAcc bit in the control register is unchanged. A value of '1' for SPrAcc is shifted out to indicate that the access would have been successful if allowed to complete; a value of '0' for SPrAcc is shifted out to indicate the access would not have been successful if allowed to complete. |

With regard to the second requirement, according to the present invention, only a predetermined portion of dmseg memory 140, referred to as the Fastdata area (e.g., 0xF.F20.0000–0xF.F20.000F), is used for Fastdata transfers. Hence, the second requirement ensures (rather than assumes) that the processor access is in fact a Fastdata access of the Fastdata area as opposed to some other address within dmseg memory 140. For example, if target processor 110 gets an exception during a block transfer while in debug mode, target processor 110 will attempt to reenter the debug exception handler. This will change the address of Address register 220 to an area in dmseg memory 140 outside of the Fastdata area. In this situation, the Fastdata access should fail; and according to the present invention, such accesses do in fact fail.

If either of the requirements described above are not satisfied, in one embodiment of the present invention, a value of '0' is shifted out of Fastdata register 250 indicating that the Fastdata access failed. When both requirements are satisfied, a value of '1' is shifted out of Fastdata register 250 indicating that the Fastdata access succeeded. In one embodiment, the value to be shifted out of Fastdata register 250 is controlled by hardware (e.g., combinatorial logic) that uses the PrAcc value in Control register 210 and the address in Address register 220 as inputs. Of course, such functionality may be implemented in other ways, including software.

Figure 4:
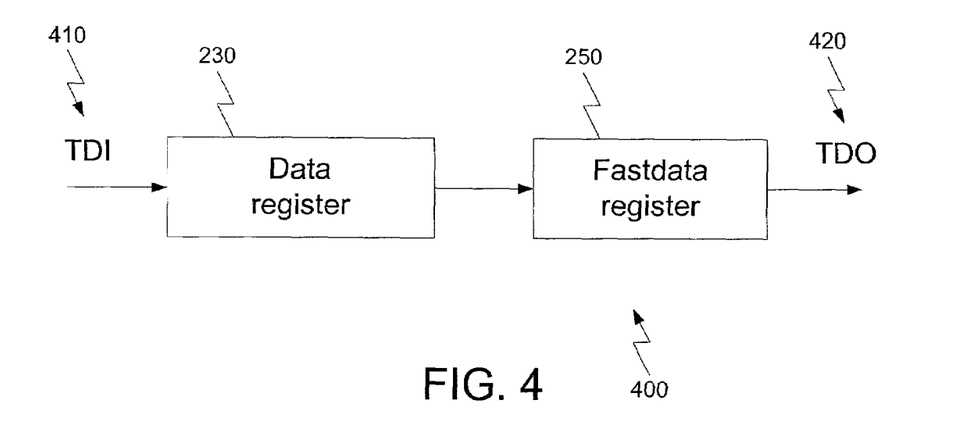
FIG. 4 illustrates a more efficient TDI-to-TDO path according to the present invention.

In order for host processor 150 and probe 130 to access the functionality of Fastdata register 250 as described in Table I, a FASTDATA command or instruction is provided. When the FASTDATA instruction is clocked to Instruction register 240 of TAP 115, TAP 115 configures a TDI-to-TDO data path 400 (i.e., a path of serial data from test data in port to test data out port) as illustrated in FIG. 4. As illustrated in FIG. 4, Data register 230 is serially coupled to Fastdata register 250 so that data clocked into a TDI port 410 from probe 130 over serial link 160 is clocked through Data register 230 and into Fastdata register 250, and subsequently clocked out to a TDO port 420. Thus, when using the FASTDATA instruction, an extra bit (i.e., the SPrAcc bit) is clocked to TAP 115 for each data word to be transferred between probe 130 and target processor 110. As illustrated in FIG. 4, the SPrAcc bit is clocked in front of the data word although in other embodiments of the present invention where the order of Data register 230 and Fastdata register 250 are reversed, the SPrAcc bit may be clocked after the data word as would be apparent.

As indicated in TABLE I, clocking in a value of 'O' for SPrAcc bit will attempt to complete the Fastdata access and when successful, will automatically change the PrAcc bit in Control register 210 to a value of 'O', thereby eliminating the need for operations 370 and 380 illustrated in FIG. 3. This further speeds the operation of the conventional block transfer loop. In one embodiment, the new value of PrAcc bit is controlled by hardware (e.g., combinatorial logic) that uses the SPrAcc value shifted into Fastdata register 250, the address in Address register 220 and the current value of PrAcc in Control register 210. Of course, such functionality may be implemented in other ways, including software.

Fastdata register 250 is used to efficiently transfer blocks of data between dmseg memory 140 and target memory 120. As described herein, an "upload" is defined as a sequence of loads from target memory 120 and stores to dmseg memory 140, while a "download" is defined as a sequence of loads from dmseg memory 140 and stores to target memory 120. These sequences are both performed by target processor 110.

During Fastdata uploads and downloads, target processor 110 is configured to "stall" on accesses to the Fastdata area of dmseg memory 140. When so stalled, the PrAcc bit in Control register 210 will indicate that target processor 110 is waiting for probe 130 to complete the access. Both upload and download accesses are attempted by clearing Fastdata register 250 (e.g., by shifting in a value of '0' for SPrAcc) and thereby requesting access completion. A value of SPrAcc subsequently shifted out of Fastdata register 250 indicates whether the attempt will be successful as described above (i.e., there was a processor access pending and a legal Fastdata area address was used). Downloads will shift in the data to Data register 230 to satisfy the load from dmseg memory 140 and uploads will shift out the data from Data register 230 to satisfy the store to dmseg memory 140.

According to the present invention, Fastdata register 250 operates in a manner similar to the PrAcc bit of Control register 210. By placing Fastdata register 250 in TDI-to-TDO path 400 with Data register 230, both data and control functions are achieved without having to switch between Data register 230 and Control register 210.

TABLE II summarizes the operation of one embodiment of the present invention when various values of SPrAcc are shifted into and out of Fastdata register 250 for Fastdata downloads and Fastdata uploads, respectively.

TABLE II

Operation of FASTDATA Accesses

| Probe Operation | Address in FastData Area? | PrAcc in the Control Register | Value of SPrAcc Shifted into FastData Register | Action in the Data Register | PrAcc in Control Register Changes to | Value of SPrAcc Shifted out of FastData Register | Data Shifted Out of Data Register |
|---|---|---|---|---|---|---|---|
| FastData Download | No | x | x | none | unchanged | 0 | invalid |
|  | Yes | 1 | 1 | none | unchanged | 1 | invalid |
|  |  | 1 | 0 | write data | 0 (Same as SPrAcc) | 1 | valid (previous) data |
|  |  | 0 | x | none | unchanged | 0 | invalid |
| FastData Upload | No | x | x | none | unchanged | 0 | invalid |
|  | Yes | 1 | 1 | none | unchanged | 1 | invalid |
|  |  | 1 | 0 | read data | 0 (Same as SPrAcc) | 1 | valid data |
|  |  | 0 | x | none | unchanged | 0 | invalid |

Figure 5:
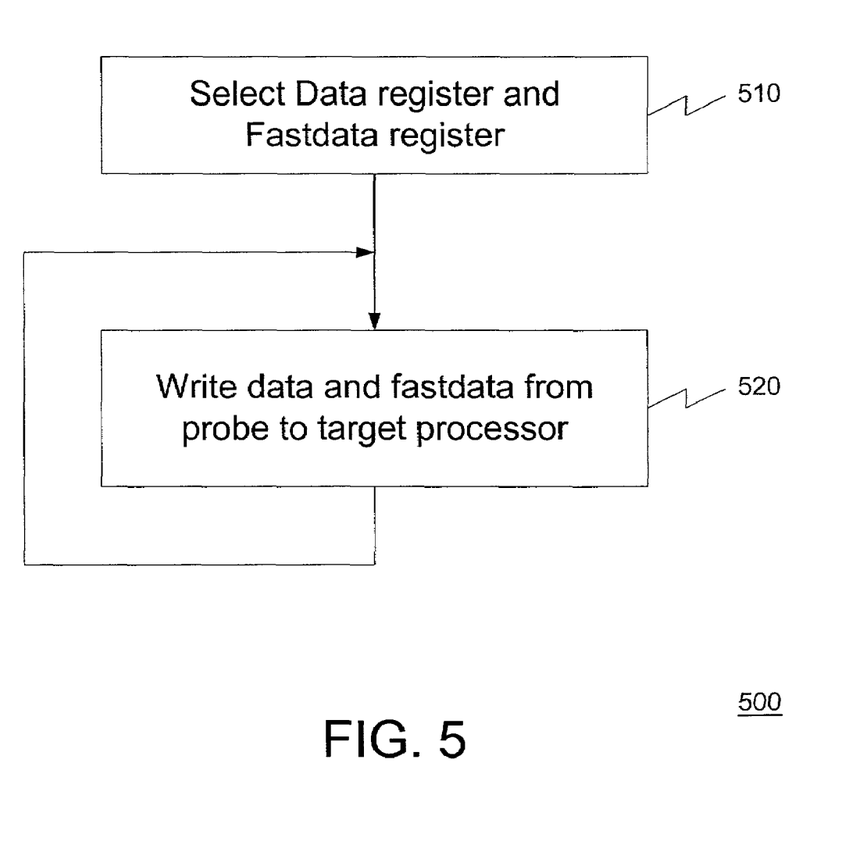
FIG. 5 illustrates a transfer of data through a test access port in accordance with an operation of the present invention.

FIG. 5 illustrates an operation 500 of an EJTAG debug system utilizing the present invention while transferring a large block of data between dmseg memory 140 and target memory 120. Specifically, the following discussion describes how a block of data is transferred from dmseg memory 140 to target memory 120. As will become apparent, a similar operation would be required to transfer a block of data from target memory 120 to dmseg memory 140 (i.e., operation 510 would stay the same and operation 520 would be "read data and fastdata from target processor and forward to probe for storage in dmseg memory").

In an operation 510, Data register 230 and Fastdata register 250 are selected as illustrated in FIG. 4. In one embodiment of the present invention, this is accomplished using the FASTDATA instruction. As described above, the FASTDATA instruction is clocked from probe 130 into Instruction register 240 of TAP 115. The FASTDATA instruction configures Data register 230 and Fastdata register 250 as TDI-to-TDO path 400. In an operation 520, one-bit corresponding to SPrAcc and n-bits of data are clocked from probe 130 to target processor 110. Operation 520 is repeated for each data word in the block of data to be transferred to target memory 120 (via a loop routine running on target processor 110, as described above). Using Fastdata register 250, only one bit of overhead is required (in addition to the initial 5 bits of set up for the FASTDATA instruction) in order to transfer n bits of data and no assumptions are made as to whether a processor access in pending or the address is correct (as described above). This is a significant improvement over the conventional test system described above.

In particular, this reduction in overhead is achieved with Fastdata register 250 for several reasons. First, probe 130 does not need to separately select and read Control register 210 in order to determine if a processor access is pending via the PrAcc bit. TAP 115 implements Fastdata register 250 so that the status of PrAcc is automatically determined (such as by using hardware) thereby preventing the Fastdata access from completing if a processor access is not pending. Second, probe 130 does not need to select and read Address register 220 to confirm it is accessing the proper address. While using the Fastdata instruction, Address register 220 need not be accessed because TAP 115 implements Fastdata register 250 so that only an access to the Fastdata area of dmseg memory 140 will be allowed to complete. This may be achieved, for example, by using hardware that automatically confirms that the current address falls within dmseg memory 140. Third, probe 130 does not need to separately select and write Control register 210 in order to indicate that the pending access has been satisfied. According to the present invention, after the Fastdata access successfully completes, the PrAcc bit is automatically reset.

While the invention has been described in detail and with reference to specific embodiments thereof, it will be apparent to one skilled in the art that various changes and modifications can be made therein without departing from the spirit and scope thereof. For example, the operation of the present invention is described in terms of shifting a certain value into or out of Fastdata register 250. As would be apparent, various other values may be used to implement the same or similar functionality. Similarly, any other mechanism for retaining and shifting data may be used in place of Fastdata register 250.

Moreover, in addition to implementations of TAP 115 embodied in hardware (e.g., within a microprocessor, microcontroller, SOC component, etc.), implementations may also be embodied in software disposed, for example, in a computer usable (e.g., readable) medium configured to store the software (i.e., computer readable program code). The program code causes the enablement of the functions or fabrication or both of the TAP-related structure and functionality described herein. For example, this can be accomplished through the use of general programming languages (e.g., C, C++), hardware description languages (HDL) including Verilog HDL, VHDL, and so on, or other available programming and/or circuit (e.g., schematic) capture tools. The program can be disposed in any known computer usable medium including semiconductor, magnetic disk, optical disk (e.g., CD-ROM, DVD-ROM) and as a computer data signal embodied in a computer usable (e.g., readable) transmission medium (e.g., carrier waves or any other medium including digital, optical or analog-based medium). As such, the code can be transmitted over communication networks including the Internet and intranets.

It is understood that the TAP-related functions and/or structures provided above can be represented in a core (e.g., microprocessor core), SOC component, etc., that is embodied in program code and may be transformed to hardware as part of the production of integrated circuits. Also, these functions and/or structures may be embodied in a combination of hardware and software. Thus, it is intended that the present invention cover the modifications and variations of this invention provided they come within the scope of the appended claims and their equivalents.

What is claimed is:

1. A test access port comprising:
a fastdata register that is selectably connectable to a data register to form at least a portion of a TDI-to-TDO path, said fastdata register configured to operate such that a fastdata access completes when a processor access is pending and said processor access is to a predetermined area of dmseg memory.

2. The test access port of claim 1, further comprising a data register serially coupled to said fastdata register.

3. The test access port of claim 1, wherein said fastdata register is configured to operate such that an attempt to complete said fastdata access occurs by clearing said fastdata register.

4. The test access port of claim 1, wherein said fastdata register is configured to operate such that said fastdata register is set to indicate that said fastdata access will complete.

5. The test access port of claim 1, wherein said fastdata register is configured to operate such that, if said processor access is not pending, said fastdata register is cleared to indicate that said fastdata access will not complete.

6. The test access port of claim 5, wherein said fastdata register is configured to operate such that, if a PrAcc bit is asserted while said processor access is not pending, said fastdata register is cleared to indicate that said fastdata access will not complete.

7. The test access port of claim 1, wherein said fastdata register is configured to operate such that, if said processor access is outside said predetermined area of dmseg memory, said fastdata register is cleared to indicate that said fastdata access will not complete.

8. A method for transferring a plurality of data words between a test probe and a target processor over a serial link, the method comprising:
directing the target processor to configure a test data in port to test data out port ("TDI-to-TDO") path to include a data register and a fastdata register;
without reconfiguring said TDI-to-TDO path, shifting each of the plurality of data words accompanied by a SPrAcc bit into said data register and said fastdata register of said TDI-to-TDO path, respectively, said SPrAcc bit indicative of a request for completion of a pending processor access.

9. The method of claim 8, further comprising receiving an indication from said TDI-to-TDO path whether said pending processor access completed.

10. The method of claim 9, wherein said receiving an indication comprises receiving an indication that said pending processor access successfully completed when a processor access was pending at a time of said request and said processor access was to a predetermined area of a dmseg memory.

11. The method of claim 9, wherein said receiving an indication comprises receiving an indication that said pending processor access failed to complete when a processor access was not pending at a time of said request.

12. The method of claim 9, wherein said receiving an indication comprises receiving an indication that said pending processor access failed to complete when a processor access was outside a predetermined area of dmseg memory.

13. A method for transferring a plurality of data words between a test probe and a target processor over a serial link, the method comprising:
 configuring a test data in port to test data out port ("TDI-to-TDO") path to include a data register and a fastdata register;
 receiving from the test probe one of the plurality of data words accompanied by an SPrAcc bit in said data register and said fastdata register of said TDI-to-TDO path, respectively, said SPrAcc bit indicating a request for completion of a pending processor access; and
 indicating to the test probe whether said pending processor access completed.

14. The method of claim 13, wherein said indicating comprises indicating to the test probe that said pending processor access successfully completed when a processor access was pending at a time of said request and said processor access was to a fastdata area of a dmseg memory.

15. The method of claim 13, wherein said indicating comprises indicating to the test probe that said pending processor access failed to complete when a processor access was not pending at a time of said request.

16. The method of claim 13, wherein said indicating comprises indicating to the test probe that said pending processor access failed to complete when a processor access was outside a fastdata area of a dmseg memory.

17. The method of claim 13, further comprising stalling on an attempt to access a fastdata area of dmseg memory.

18. A method for transferring a plurality of data words between a test probe and a target processor over a link, the method comprising:
 requesting a serial data transfer;
 receiving control information in said serial data transfer, said control information indicative of a request for completion of a processor access; and
 confirming said processor access is pending and a target address associated with said processor access falls within a predetermined acceptable range of memory addresses.

19. The method of claim 18 further comprising enabling said serial data transfer upon successfully confirming said processor access is pending and said target address associated with said processor access falls within a predetermined acceptable range of memory addresses for one of said plurality of data words.

20. The method of claim 19 wherein said confirming said processor access is pending comprises detecting a value of a control bit.

21. The method of claim 20 further comprising resetting said value of said control bit after successfully confirming said processor access is pending.

22. The method of claim 19 wherein said confirming said processor access is pending and a target address associated with said processor access falls within a predetermined acceptable range of memory addresses is achieved without use of the probe.

23. The method of claim 22 wherein said control information is modified to indicate success or failure of confirming said processor access is pending and a target address associated with said processor access falls within a predetermined acceptable range of memory addresses for said one of said plurality of data words.

24. The method of claim 21 wherein said resetting said value of said control bit is achieved without use of the probe.

25. The method of claim 18 further comprising:
 in response to direction from the probe, configuring a test-data-in-port to test-data-out-port ("TDI-to-TDO") path to include a data register and a Fastdata register; and
 without reconfiguring said TDI-to-TDO path, shifting each of said plurality of data words accompanied by said control information in modified or unmodified form over said TDI-to-TDO path and the link.

26. The method of claim 25 wherein said control information is an SPrAcc bit associated with each of said plurality of data words.

27. The method of claim 26 wherein said configuring TDI-to-TDO path to include a data register and a Fastdata register is achieved in response to receiving a FASTDATA instruction from the probe.

28. A computer-readable medium comprising a programmable device described in software, the programmable device including a test access port comprising:
 a Fastdata register that is selectably connectable to a data register to form at least a portion of a test-data-in-port to test-data-out-port path, said Fastdata register configured to operate such that a fastdata access completes when a processor access is pending and said processor access is to a predetermined area of memory.

29. The computer readable medium of claim 28 wherein the programmable device is a microprocessor core.

30. A method for transferring a plurality of data words between a test probe and a target processor over a link, the method comprising:
 in response to a request from the target processor for a serial data transfer, including control information in said serial data transfer, said control information indicative of a request for completion of a processor access; and
 receiving second control information that confirms said processor access was pending and a target address associated with said processor access falls within a predetermined acceptable range of memory addresses.

31. The method of claim 30 further comprising:
 directing that target processor to configure a test-data-in-port to test-data-out-port ("TDI-to-TDO") path to include a data register and a Fastdata register; and
 shifting each of said plurality of data words accompanied by said control information in modified or unmodified form over said TDI-to-TDO path and the link.

32. The method of claim 31 wherein said control information is an SPrAcc bit associated with each of said plurality of data words shifted into said TDI-to-TDO path.

33. The method of claim 31 wherein said second control information is an SPrAcc bit associated with each of said plurality of data words shifted out of said TDI-to-TDO path.

34. The method of claim 31 wherein said directing the target processor to configure a TDI-to-TDO path to include a data register and a Fastdata register is achieved by sending a FASTDATA instruction.

* * * * *